(12) United States Patent
Chen et al.

(10) Patent No.: US 6,635,517 B2
(45) Date of Patent: Oct. 21, 2003

(54) USE OF DISPOSABLE SPACER TO INTRODUCE GETTERING IN SOI LAYER

(75) Inventors: Tze-Chiang Chen, Yorktown Heights, NY (US); Thomas T. Hwang, Wappingers Falls, NY (US); Mukesh V. Khare, White Plains, NY (US); Effendi Leobandung, Wappingers Falls, NY (US); Anda C. Mocuta, LaGrangeville, NY (US); Paul A. Ronsheim, Hopewell Junction, NY (US); Ghavam G. Shahidi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/924,014

(22) Filed: Aug. 7, 2001

(65) Prior Publication Data

US 2003/0032251 A1 Feb. 13, 2003

(51) Int. Cl.[7] .................... H01L 21/335; H01L 21/8232
(52) U.S. Cl. ......................... 438/143; 438/58; 438/402; 438/411; 438/473
(58) Field of Search ................................ 438/581, 143, 438/402, 471, 473

(56) References Cited

U.S. PATENT DOCUMENTS

| | | | |
|---|---|---|---|
| 4,722,909 A | | 2/1988 | Parrillo et al. |
| 5,244,819 A | | 9/1993 | Yue |
| 5,753,560 A | | 5/1998 | Hong et al. |
| 5,840,590 A | * | 11/1998 | Myers, Jr. et al. |
| 5,976,956 A | * | 11/1999 | Gardner et al. ............. 438/473 |
| 6,238,960 B1 | * | 5/2001 | Maszara et al. ............ 438/197 |
| 6,331,486 B1 | * | 12/2001 | Cabral, Jr. et al. .......... 438/682 |
| 6,369,410 B1 | * | 4/2002 | Yamazaki et al. ............ 257/72 |

OTHER PUBLICATIONS

"Twin–Well CMOS Process Sequence," Silicon Processing For The VLSI ERA, vol II, pp. 433–438.

* cited by examiner

Primary Examiner—Long Pham
(74) Attorney, Agent, or Firm—Scully, Scott, Murphy & Presser; H. Daniel Schnurmann

(57) ABSTRACT

A method of forming a self-aligned gettering region within an SOI substrate is provided. Specifically, the inventive method includes the steps of forming a disposable spacer on each vertical sidewall of a patterned gate stack region, the patterned gate stack region being formed on a top Si-containing layer of an SOI substrate; implanting gettering species into the top Si-containing layer not protected by the disposable spacer and patterned gate stack region; and removing the disposable spacer and annealing the implanted gettering species so as to convert said species into a gettering region.

25 Claims, 2 Drawing Sheets

USE OF DISPOSABLE SPACER TO INTRODUCE GETTERING IN SOI LAYER

FIELD OF THE INVENTION

The present invention relates to semiconductor device manufacturing, and more particularly to a method for introducing an impurity gettering layer or region into a top Si-containing layer of a silicon-on-insulator (SOI) wafer.

BACKGROUND OF THE INVENTION

In the semiconductor industry, SOI technology is becoming increasingly important since it permits the formation of high-speed circuits. Moreover, SOI devices offer many more advantages over their bulk counterparts including, for example, higher performance, absence of latch-up, higher packing density and low voltage applications.

In a typical SOI wafer, a buried oxide layer is sandwiched between a bottom Si-containing layer, e.g., a Si-containing substrate, and a top Si-containing layer. The buried oxide layer is used to electrically isolate an integrated circuit (IC) fabricated in the top Si-containing layer from the Si-containing substrate. This improves device performance because the buried oxide layer eliminates parasitic capacitance and it allows strong gate to body coupling to improve drive-on current.

Despite the above advantages, SOI wafers have some problems associated therewith. One problem is that there is an absence of a good gettering layer which removes metallic contamination or impurities in the IC. In a typical bulk semiconductor wafer, the backside of the wafer is typically designed to act as a metal gettering layer. Methods such as providing a heavily doped polysilicon layer on the backside of the wafer or providing a rough backside surface are typically used in bulk semiconductor technology to introduce a gettering layer to the backside of the wafer. In SOI technology, the buried oxide layer blocks metal from getting into the back of the wafer. Thus, an SOI wafer is more sensitive to top silicon metal contamination. Hence, once metal is able to diffuse in the top Si-containing layer of an SOI wafer it has nowhere to go and the metal contamination will damage the device gate dielectric.

U.S. Pat. No. 5,244,819 to Yue describes a method of providing a frontside gettering layer in an SOI wafer. The gettering layer in Yue is formed by ion implanting species such as Ar, He and Ge into the top Si layer of an SOI substrate. In order to ensure that the gettering layer is not formed in the active device area (i.e., the device channel region) of the top Si layer, a masking layer is used to define the active area. The masking layer is applied to the SOI substrate prior to implantation and a lithographic process is used in defining the masking layer. In accordance with the disclosure of Yue, the non-active device areas (i.e., source/drain regions) of the top Si layer are left exposed and the active device areas are protected by the patterned masking layer.

U.S. Pat. No. 5,753,560 to Hong, et al. disclose another method of introducing a gettering layer into the top Si layer of an SOI substrate. As was the case in Yue, Hong, et al. use a masking level to ensure that the gettering layer is not introduced into the active device areas.

Although the methods used in Yue and Hong, et al. are capable of providing a gettering layer into the top Si layer of an SOI substrate, the Yue and Hong, et al. processes are not self-aligned, and a costly lithographic process is required in these prior art processes to ensure that the gettering layer is not implanted into the active device regions of the SOI substrate.

In view of the above, there is still a need for providing a new and improved method of forming a gettering layer (or region) into non-active device areas of a top Si-containing layer of an SOI substrate that is self-aligned, and which avoids the use of a mask to define the gettering region. A method which eliminates the mask to define the gettering region is beneficial since such a method would also eliminate the costly lithographic process required in prior art methods.

SUMMARY OF THE INVENTION

One object of the present invention is to provide a method of introducing a gettering region into the non-active device areas of a top Si-containing layer of an SOI substrate.

Another object of the present invention is to provide a method of introducing a gettering region into the non-active device areas of a top Si-containing layer of an SOI substrate which is self-aligned.

A still further object of the present invention is to provide a method of introducing a gettering region into the non-active device areas of a top Si-containing layer of an SOI substrate wherein a mask (i.e., litho level) is not required to define the gettering region.

These and other objects and advantages are achieved in the present invention by forming a disposable spacer on each vertical sidewall of a patterned gate stack region prior to forming the gettering region. Because of the spacer, the gettering region will be automatically self-aligned to the patterned gate stack region and it will not impact the active device region, i.e., device channel region. The disposable spacer can then be removed after formation of the gettering region and normal complementary metal oxide semiconductor (CMOS) device processing may be resumed.

It noted that in the inventive method the gettering region is introduced into the top Si-containing layer of an SOI substrate after the gate dielectric has been formed thereon. The benefit of such a method is that it does not impact the formation of the gate dielectric. In addition, any metal contamination that is introduced before the gate dielectric is formed could be gettered away using an acid such as HCl immediately before formation of the gate dielectric.

Another feature of the present invention is that the gettering region is introduced into the SOI substrate prior to any high temperature processes are performed. Thus, if any metal is present during the high temperature processes no damage to the gate region occurs in the present invention.

Specifically, the method of the present invention comprises the steps of:

(a) forming a disposable spacer on each vertical sidewall of a patterned gate stack region, said patterned gate stack region is formed on a top Si-containing layer of an SOI substrate;

(b) implanting gettering species into said top Si-containing layer not protected by said disposable spacer and said patterned gate stack region; and (c) removing said disposable spacer and annealing the implanted gettering species so as to convert said gettering species into a gettering region.

DETAILED DESCRIPTION OF THE INVENTION

Figure 1:
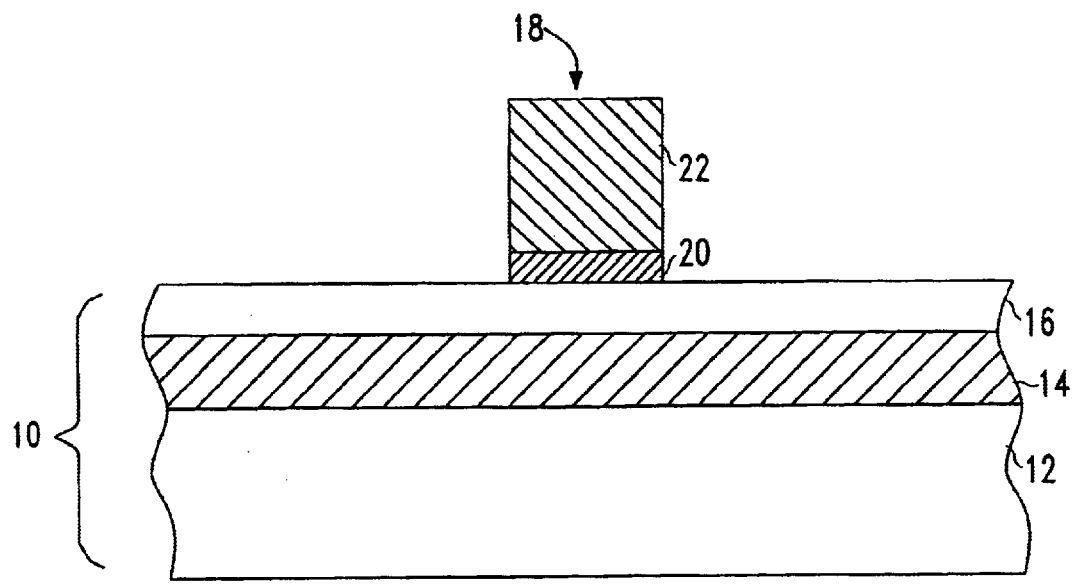
FIGS. 1–4 are pictorial representations (through cross-sectional views) showing the basic processing steps of the present invention.
Figure 2:
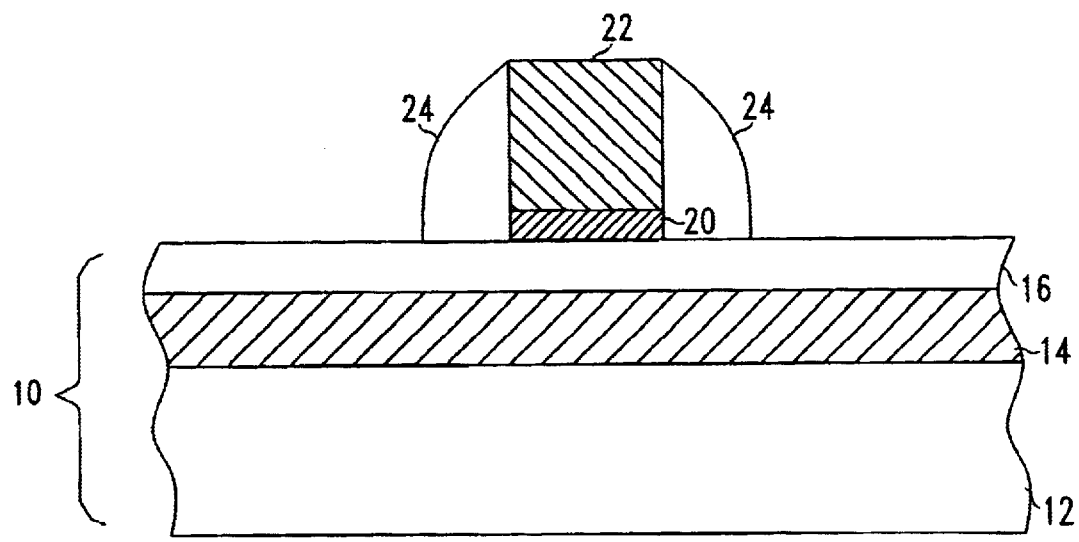

The present invention, which is directed to a self-aligned method of introducing a gettering region into non-active device regions of a top Si-containing layer of an SOI substrate, will now be described in greater detail by referring to the drawings the accompany the present application. It is noted that in the accompanying drawings, like and/or corresponding elements are referred to by like reference numerals.

Reference is first made to FIG. 1 which is an illustration of an initial structure that is employed in the present invention. Specifically, the initial structure shown in FIG. 1 comprises SOI substrate 10 having patterned gate stack region 18 formed on a surface thereof. The SOI substrate includes buried oxide layer 14 which is sandwiched between top Si-containing layer 16 and bottom Si-containing layer 12. Note that the bottom Si-containing layer is the substrate of the device, whereas the top Si-containing layer is the area wherein IC devices will be subsequently formed. Note that the buried oxide region is either a continuous layer, as depicted, or the buried oxide region is comprised of discrete and isolated islands which are surrounded on all sides by a Si-containing material. The patterned gate stack region includes gate stack 22 formed atop gate dielectric 20.

The term "Si-containing layer" as used herein denotes any semiconducting material that includes silicon. For example, the Si-containing layer may comprise Si, SiGe, SiC, SiGeC, Si/Si, or Si/SiGe.

The SOI substrate employed in the present invention is fabricated using techniques well known to those skilled in the art. For example, the SOI substrate may be formed by a conventional bonding and cutting process, or alternatively, a conventional separation by implantation of oxygen (SIMOX) process may be employed in forming the same.

The thickness of the various SOI layers is not critical to the present invention, but typically, top Si-containing layer 16 of SOI substrate 10 has a thickness of from about 30 to about 200 nm, with a thickness of from about 100 to about 150 nm being more highly preferred. Buried oxide region 14 of SOI substrate 10, which isolates top Si-containing layer 16 from bottom Si-containing layer 12, has a thickness of from about 50 to about 500 nm, with a thickness of from about 100 to about 200 nm being more highly preferred. The thickness of the bottom Si-containing layer is inconsequential to the present invention.

The patterned gate stack region is then formed atop Si-containing layer 16 using processing techniques well known in the art. For example, patterned gate stack region 18 is fabricated by first forming gate dielectric 20 on the exposed surface of top Si-containing layer 16. The gate dielectric may be formed by a conventional deposition process such as CVD or plasma-assisted CVD, or alternatively, the gate dielectric may be formed by a thermal growing process such as oxidation, nitridation or oxynitridation.

The gate dielectric employed in the present invention includes any dielectric material such as an oxide, nitride, oxynitride or any combination and multilayer thereof. It is noted that the gate dielectric thus may be a conventional gate dielectric material such as $SiO_2$ or $Si_3N_4$, or alternatively, high-k dielectrics such as oxides of Ta, Zr, Hf, Al or combinations thereof may be employed. In one highly preferred embodiment of the present invention, the gate dielectric is comprised of an oxide such as $SiO_2$, $ZrO_2$, $HfO_2$, $Ta_2O_5$ or $Al_2O_3$.

The thickness of the gate dielectric is not critical to the present invention, but typically, gate dielectric has a thickness of from about 1 to about 20 nm, with a thickness of from about 1.5 to about 10 nm being more highly preferred.

After forming the gate dielectric on the top Si-containing layer, gate stack 22 is formed on the gate dielectric utilizing a conventional deposition process such as CVD, plasma-assisted CVD or plating. The gate stack of the present invention includes at least a gate material which may further contain an optional dielectric-capping layer (not shown). The term "gate material" as used herein denotes a conductive material, a material that can be made conductive via a subsequent process such as ion implantation, or any combination thereof. Illustrative examples of suitable gate materials that can be employed in the present invention include, but are not limited to: polysilicon, amorphous silicon, elemental metals such as W, Pt, Pd, Ru, Rh and Ir, alloys of these elemental metals, silicides or nitrides of these elemental metals, and combinations thereof, e.g., a gate stack including a layer of polysilicon and a layer of conductive metal. A highly preferred gate material employed in the present invention is a gate material that is comprised of polysilicon or amorphous silicon.

The gate material is formed on the surface of gate dielectric 20 utilizing conventional deposition processes well known in the art including, but not limited to: CVD, plasma-assisted CVD, evaporation, plating, or chemical solution deposition. When metal silicides are employed, a conventional silicide process may be used in forming the silicide layer. One such silicide process that can be used in the present invention includes the steps of: first forming an elemental metal, annealing the elemental metal so as to form a metal silicide layer therefrom, and removing any unreacted elemental metal utilizing a conventional wet etch process that has a high selectivity for removing unreacted metal as compared to silicide.

It is noted that in embodiments wherein a gate stack comprising at least two conductive materials is employed, e.g., a stack of polysilicon and elemental metal, an optional diffusion barrier (not shown in the drawings) may be formed between each layer of the gate stack. The optional diffusion barrier, which is formed utilizing conventional deposition processes such as those mentioned hereinabove, is comprised of a material such as SiN, TaN, TaSiN, WN, TiN and other like materials which can prevent diffusion of a conductive material therethrough.

As stated above, an optional dielectric-capping layer may be present atop the gate material. When present, the optional dielectric-capping layer is comprised of an oxide, nitride or oxynitride and it is formed utilizing a conventional deposition process such as, for example, CVD or plasma-assisted CVD. Alternatively, a conventional thermal growing process such as, for example, oxidation, may be used in forming the optional dielectric-capping layer.

Following formation of the gate stack on the gate dielectric, the gate stack and gate dielectric are subjected to a conventional patterning process which includes a lithography step and an etching step. The lithography step includes, applying a photoresist to the gate stack, exposing the photoresist to a pattern of radiation, and developing the pattern utilizing a conventional resist developer. Following the lithography step, a conventional dry etching process such as reactive-ion etching, plasma etching, ion beam etching or laser ablation may be employed in transferring the pattern to the gate stack and the gate dielectric. Note a single etching step which is capable of selectively removing both the gate stack and the gate dielectric may be employed, or multiple etching steps can be performed which first removes the gate stack stopping on the gate dielectric and thereafter the gate dielectric is removed stopping on the top Si-containing layer.

It is emphasized that although FIG. 1 shows only one patterned gate stack region on the surface of the SOI substrate, the present invention works equally well when a plurality of patterned gate stacks are formed on the surface of top Si-containing layer 16. Thus, the present invention is not limited to the embodiment wherein a single patterned gate stack region is employed.

At this point of the present invention, disposable spacer 24 may be formed on each exposed vertical sidewall of patterned gate region 18 utilizing a conventional deposition process, such as CVD or plasma-assisted CVD, followed by etching. The disposable spacer is comprised of a conventional dielectric material such an oxide, nitride, oxynitride or any combination and multilayer thereof. Alternatively, the disposable spacer may be comprised of a conventional photoresist material.

In accordance with the present invention, thick disposable spacers are employed. That is, disposable spacers having a sufficient thickness that prevents the gettering region from being formed in the channel device region are employed in the present invention. Typically, the disposable spacers having a thickness of from about 100 to about 300 nm, with a thickness of from about 150 to about 200 nm being more highly preferred. Note that the disposable spacers are larger, i.e., thicker, than typical metal oxide semiconductor field effect transistor (MOSFET) spacers that define the deep source/drain regions.

Figure 3:
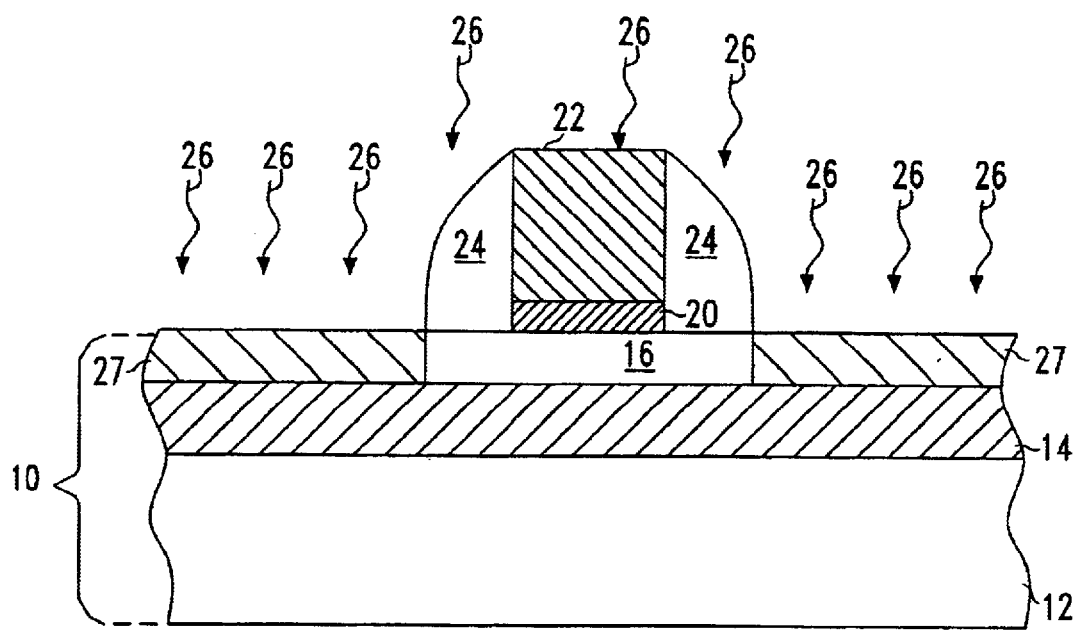

Next, and as shown in FIG. 3, gettering species 26 are implanted into top Si-containing layer 16 not protected by disposable spacer 24 and patterned gate stack region 18. The gettering species employed in the present invention include: argon (Ar), helium (He), germanium (Ge), and mixtures thereof, i.e., Ar—He. A highly preferred gettering species employed in the present invention is Ar.

The gettering species are implanted into the top Si-containing layer of the SOI substrate by using a heavy ion dose which is capable of forming damaged regions (or gettering sites) 27 within the top Si-containing layer. Specifically, the gettering species are implanted using an ion dose of about 1E15 cm$^{-2}$ or greater. More specifically, the gettering species are implanted using an ion dose of from about 1E15 to about 5E15 cm$^{-2}$. Note the implant energy used at this point of the present invention may vary depending on the type of gettering species employed.

Using the above conditions, the gettering species are incorporated into the surface of the top Si-containing layer to a maximum depth (as measured from the top Si-containing layer) of from about 30 to about 150 nm. Note that in some embodiments the gettering species are implanted to a depth that is in direct contact with the underlying buried oxide region.

After implanting the gettering species into the top Si-containing layer of the SOI substrate, the disposable spacers are removed from the structure using a conventional stripping process well known in the art. For example, the disposable spacers can be removed by using a wet etching process, which includes a chemical etchant such as HF, sulfuric acid or phosphoric acid.

Figure 4:
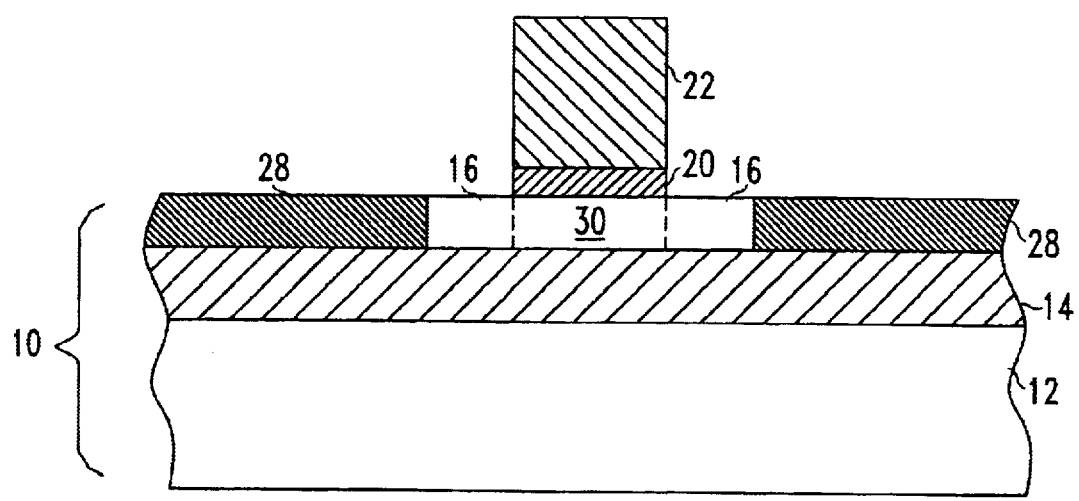

Next, the structure not containing the disposable spacers is then annealed so as to convert the implanted gettering species into gettering region 28, See FIG. 4. That is, annealing is performed under conditions which are sufficient to cause bubble formation of the gettering species. The bubbles are of sufficient size and quantity so as to allow gettering and subsequent removal of any metal contaminates in the top Si-containing layer of the SOI substrate.

Specifically, the annealing is performed in an inert gas ambient (such as He, $N_2$, Ar, Kr, Xe, and mixtures thereof) using either a furnace annealing process or a rapid thermal annealing (RTA) process. One highly preferred inert gas ambient employed in the present invention is $N_2$.

When a furnace annealing process is employed in the present invention, the annealing step is carried out at a temperature of about 900° C. or greater for a time period of about 30 minutes or greater. More preferably, furnace annealing is carried out at a temperature of from about 900° to about 1000° C. for a time period of from about 30 to about 60 minutes.

When a rapid thermal annealing (RTA) process is employed, the RTA is carried out at a temperature of about 900° C. or greater for a time period of about 30 seconds or less. More preferably, RTA is carried out at a temperature of from about 900° to about 1000° C. for a time period of from about 5 to about 15 seconds.

In one embodiment of the present invention, a single heating temperature is employed in the annealing step. In another embodiment of the present invention, a soaking and heating regime may be employed wherein various ramp rates are employed to heat and cool the structure to a desired targeted value.

It is noted that the above conditions for the furnace annealing and RTA are exemplary and that other conventional conditions which are capable of converting the implanted gettering species into an active gettering region may be employed in the present invention. Additionally, the annealing step is not limited to just furnace annealing and RTA. Instead, other annealing processes such as microwave annealing and laser annealing are also contemplated herein.

Note that gettering region 28 is formed in non-active device regions of the SOI substrate, not in the active channel device region which is labeled as reference numeral 30 in FIG. 4. Note also that the gettering region formed is self-aligned with the disposable spacers and does not encroach upon the active device regions in the structure.

Following the above processing steps, conventional CMOS processing steps may be employed. That is, after forming the gettering region into the non-active device regions of the top Si-containing layer, source/drain extension regions may be formed into the top Si-containing layer using conventional ion implantation and activation annealing. Following the formation of source/drain extension regions, permanent spacers may be formed on the vertical sidewalls of the patterned gate region and deep source/drain diffusion region may be formed utilizing conventional ion implantation and activation annealing.

In addition to the above CMOS processing steps, the present invention also contemplates the formation of raised source/drain regions and/or silicide regions abutting the patterned gate region. The raised source/drain regions and the silicide regions are formed utilizing conventional processes well known in the art including epi Si growth and silicidation, respectively.

While this present invention has been particularly shown and described with respect to preferred embodiments thereof, it will be understood by those skilled in the art that the foregoing and other changes in forms and details may be made without departing from the spirit and scope of the present invention. It is therefore intended that the present invention is not limited to the exact forms and details described and illustrated, but fall within the scope of the appended claims.

Having thus described our invention in detail, what we claim as new and desire to secure by the Letters Patent is:

1. A method of fabricating a silicon-on-insulator (SOI) device comprising the steps of:
   (a) forming a disposable spacer on each vertical sidewall of a patterned gate stack region, said patterned gate stack region being located on a top Si-containing layer of an SOI substrate;
   (b) forming gettering regions self-aligned with active regions and gettering into non-active device areas of said top Si-containing layer by implanting without a mask gettering species into said top Si-containing layer that are not protected by said disposable spacer and by said gate stack region, said maskless implant forming gettering regions that are symmetrical with respect to the gate region; and
   (c) removing said disposable spacer and annealing said implanted gettering species.

2. The method of claim 1 wherein said SOI substrate is made by bonding and cutting or by a separation by implantation of oxygen process.

3. The method of claim 1 wherein a buried oxide region is present beneath said top Si-containing layer of said SOI substrate.

4. The method of claim 3 wherein said buried oxide region is continuous or is comprised of discrete and isolated regions that are surrounded by a Si-containing material.

5. The method of claim 3 wherein said buried oxide regions electrically isolate said top Si-containing layer from a bottom Si-containing layer.

6. The method of claim 1 wherein said top Si-containing layer is comprised of a semiconductor material selected from the group consisting of Si, SiGe, SiC, SiGeC, Si/Si, and Si/SiGe.

7. The method of claim 1 wherein said disposable spacer is formed by deposition and etching.

8. The method of claim 1 wherein said disposable spacer is an oxide, a nitride, an oxynitride, a photoresist or any combination and multilayer thereof.

9. The method of claim 1 wherein said disposable spacer has a thickness of from about 100 to about 300 nm.

10. The method of claim 9 wherein said disposable spacer has a thickness of from about 150 to about 200 nm.

11. The method of claim 1 wherein said gettering species is Ar, He, Ge or any mixture thereof.

12. The method of claim 11 wherein said gettering species is Ar.

13. The method of claim 1 wherein said gettering species are implanted at an ion dose of about 1E15 $cm^{-2}$ or greater.

14. The method of claim 13 wherein said gettering species are implanted at an ion dose of from about 1E15 to about 5E15 $cm^{-2}$.

15. The method of claim 1 wherein said disposable spacer is removed by a stripping process.

16. The method of claim 1 wherein said disposable spacer is removed by a wet etching process.

17. The method of claim 1 wherein said annealing is a furnace anneal, a rapid thermal anneal, a microwave anneal or a laser anneal.

18. The method of claim 17 wherein said annealing is a furnace anneal which is carried out at a temperature of about 900° C. or greater for a time period of about 30 minutes or greater.

19. The method of claim 18 wherein said annealing is a furnace anneal which is carried out at a temperature of from about 900° to about 1000° C. for a time period of from about 30 to about 60 minutes.

20. The method of claim 17 wherein said annealing is a rapid thermal anneal which is carried out at a temperature of about 900° C. or greater for a time period of about 30 seconds or less.

21. The method of claim 20 wherein said annealing is a rapid thermal anneal which is carried out at a temperature of from about 900° to about 1000° C. for a time period of from about 5 to about 15 seconds.

22. The method of claim 1 wherein said annealing is carried out in an inert gas ambient.

23. The method of claim 1 wherein said annealing is carried out using a ramp and soak heating regime.

24. A method of fabricating a silicon-on-insulator (501) device, said method comprising the steps of:
   (a) forming a disposable spacer on each vertical sidewall of a patterned gate stack region, said patterned gate stack region being located on a top Si-containing layer of an SOI substrate;
   (b) forming gettering regions self-aligned with active regions and gettering into non-active device areas of said top Si-containing layer by implanting without a mask gettering species into said top Si-containing layer that are not protected by said disposable spacer and said patterned gate stack region using an implant dose of about 1E15 $cm^{-2}$ or greater, said maskless implant forming gettering regions that are symmetrical with respect to the gate stack region; and
   (c) removing said disposable spacer and annealing the implanted gettering species.

25. A method of forming a self-aligned gettering region within an SOI substrate, said method comprising the steps of:
   (a) forming a disposable spacer on each vertical sidewall of a patterned gate stack region, said patterned gate stack region being located on a top Si-containing layer of an SOI substrate;
   (b) implanting gettering species into said top Si-containing layer not protected by said disposable spacer and said patterned gate stack region, wherein said implanting is performed in the absence of a lithographic masking layer; and
   (c) removing said disposable spacer and annealing the implanted gettering species so as to convert said gettering species into a gettering region that is self-aligned with active regions.

* * * * *